US011239190B2

(12) United States Patent
Guevara et al.

(10) Patent No.: US 11,239,190 B2
(45) Date of Patent: Feb. 1, 2022

(54) SOLDER-METAL-SOLDER STACK FOR ELECTRONIC INTERCONNECT

(71) Applicant: Texas Instruments Incorporated, Dallas, TX (US)

(72) Inventors: Rafael Jose Lizares Guevara, Manila (PH); Maricel Fabia Escaño, Angeles (PH); Arvin Cedric Quiambao Mallari, San Fernando (PH); Jovenic Romero Esquejo, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/738,612

(22) Filed: Jan. 9, 2020

(65) Prior Publication Data

US 2021/0217718 A1 Jul. 15, 2021

(51) Int. Cl.
| H01L 23/31 | (2006.01) |
| H01L 23/495 | (2006.01) |
| H01L 21/48 | (2006.01) |
| H01L 21/56 | (2006.01) |
| H01L 21/78 | (2006.01) |
| B23K 35/02 | (2006.01) |
| B23K 35/26 | (2006.01) |
| B23K 101/40 | (2006.01) |
| H01L 23/00 | (2006.01) |

(52) U.S. Cl.
CPC .......... *H01L 24/13* (2013.01); *B23K 35/0222* (2013.01); *B23K 35/262* (2013.01); *H01L 21/4825* (2013.01); *H01L 21/565* (2013.01); *H01L 21/78* (2013.01); *H01L 23/3114* (2013.01); *H01L 23/4951* (2013.01); *H01L 24/11* (2013.01); *B23K 2101/40* (2018.08); *H01L 2224/11462* (2013.01); *H01L 2224/11849* (2013.01); *H01L 2224/13008* (2013.01); *H01L 2224/13026* (2013.01); *H01L 2224/13084* (2013.01); *H01L 2224/13111* (2013.01); *H01L 2224/13139* (2013.01); *H01L 2224/13147* (2013.01); *H01L 2924/014* (2013.01); *H01L 2924/0105* (2013.01); *H01L 2924/01029* (2013.01); *H01L 2924/01047* (2013.01)

(58) Field of Classification Search
CPC ....................................................... H01L 24/13
See application file for complete search history.

(56) References Cited

U.S. PATENT DOCUMENTS

| 9,674,952 B1 | 6/2017 | Liu et al. | |
| 2007/0111394 A1* | 5/2007 | Lee ................... | H01L 23/49551 438/123 |
| 2008/0251927 A1* | 10/2008 | Zhao ....................... | H01L 24/11 257/762 |
| 2015/0061118 A1* | 3/2015 | Chen .................... | B23K 1/0016 257/737 |

\* cited by examiner

*Primary Examiner* — William A Harriston
(74) *Attorney, Agent, or Firm* — Ronald O. Neerinqs; Charles A. Brill; Frank D. Cimino

(57) ABSTRACT

An electronic device includes a substrate having top side contact pads including metal pillars thereon or a laminate substrate having land pads with the pillars thereon. A solder including layer stack is on the pillars, the solder including layer stack having a bottom solder material layer including in physical contact with a top surface of the pillars, a metal material layer, and a capping solder material layer on the metal material layer. The metal material layer is primarily a copper layer or an intermetallic compound (IMC) layer including copper.

18 Claims, 5 Drawing Sheets

SOLDER-METAL-SOLDER STACK FOR ELECTRONIC INTERCONNECT

FIELD

This Disclosure relates to electrical interconnects including solder for connections to pillars on contact pads such as bond pads or bump pads on semiconductor die, or to contact pads on other substrates.

BACKGROUND

Electromigration (EM) is a significant consideration for semiconductor devices because it can result in the failure of package semiconductor devices. Solder connections are commonly used between the bond pads or bump pads on a semiconductor die and the leads or lead terminals of a leadframe for a flipchip on lead package arrangement, where a semiconductor die having solder bumps on its bond pads or bump pads is flipped onto the leads or lead terminals of a leadframe. The semiconductor die is attached to the die pad and is electrically bonded to the leads or lead terminals of the leadframe through re-flowing of solder on the bond pads or on the bump pads. The solder can be in the form of a solder on copper pillars that are on the bond pads or on the bump pads.

Solder is also commonly used to attach a semiconductor die to a printed circuit board (PCB) by depositing a solder bump commonly to pillars on each bond pad or bump pad on the semiconductor die. In order to mount the semiconductor die to the PCB, the semiconductor die is flipped over so that its bond pads or bump pads align with matching contact pads on the PCB, and then the solder is reflowed to complete the interconnects.

EM for a solder bump relates to the amount of current that can be pumped through a particular bump. An EM failure of a semiconductor device or a semiconductor package is a phenomenon in which metal atoms receive momentum from the electron flow and in response diffuse in the same direction as the electron flow.

Tin-silver-copper (SnAgCu, also known as a SAC alloy), is a lead-free (Pb-free) alloy commonly used as the solder material for electronic devices. The SAC alloy has been the prevailing alloy system that has replaced SnPb because it is near eutectic, with generally sufficient thermal fatigue properties, strength, and wettability. Typical SAC alloys are 3 to 4% silver, 0.5 to 0.7% copper, and the balance (95%+) Sn. For example, the conventional "SAC305" solder is 3.0% silver and 0.5% copper with the balance being Sn. SAC alloys are the main choice for Pb-free surface-mount technology (SMT) assembly in the electronics industry. SMT is a process where components of circuit assemblies are mounted directly onto the land pads of a PCB, and are soldered in place.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a solder comprising layer stack including copper for a new bonding feature for electrical interconnects for electronic assemblies. A disclosed solder comprising layer stack is on pillars that are on contact pads (bond pads or bump pads on a semiconductor substrate or on land pads of a laminated substrate) for electrically connecting a substrate to another substrate such as a laminate substrate (e.g., a PCB) or to leads or lead terminals of a leadframe. One particular arrangement comprises a semiconductor die having pillars on bond pads or bump pads including a disclosed solder comprising layer stack on the pillar which are flipchip attached to a leads or lead terminals of a leadframe.

The solder comprising layer stack can be formed by heating (reflowing) a SnAg solder material on both sides of a metal comprising layer that including at least primarily copper that diffuses the copper into the adjoining SnAg material to effectively form a SAC solder material. The presence of copper in the solder improves the EM performance of the bond. A copper layer can be electroplated or deposited by another method such as by sputtering in between a top and a bottom SnAg layer on a pillar on a bump pad or on a bond pad on a semiconductor die, to ensure a more uniform diffusion copper atoms into the bulk solder layers to improve device reliability.

Disclosed bonding arrangements including a disclosed solder comprising layer stack that changes the bump stack profile which improves control of the effective bond line thickness (BLT). Also, disclosed aspects can convert SnAg into a material similar to a SAC material which improves the EM performance of the bonding arrangement.

Disclosed bonding arrangements also solve the problem of solder bridging after die attach and reflow on flipchip quad flat no lead (QFN) devices brought about by solder volume, bump pitch as well as flux depth. Another problem is package electromigration (EM) performance which is described as the amount of current capable of being pumped through a bump unit area. Disclosed aspects solve this problem by changing the bump stack profile in order to control the effective BLT and convert the generally electroplated SnAg material into a material that has copper as with SAC material, which due to the addition of copper performs better in terms of EM as compared to SnAg.

Disclosed aspects include an electronic assembly comprising a substrate having top side contact pads including metal pillars thereon, or a laminate substrate having land pads with the pillars thereon. A solder comprising layer stack is on the pillars. The solder comprising layer stack comprises a bottom solder material layer including in physical contact with a top surface of the pillars, a metal material layer on the bottom solder material layer, and a capping solder material layer on the metal material layer. The metal material layer comprises primarily a copper layer (meaning ≥50.1 atomic percent copper), or an intermetallic compound (IMC) comprising layer including copper.

BRIEF DESCRIPTION OF THE DRAWINGS

Reference will now be made to the accompanying drawings, which are not necessarily drawn to scale, wherein.

DETAILED DESCRIPTION

Figure 1A:
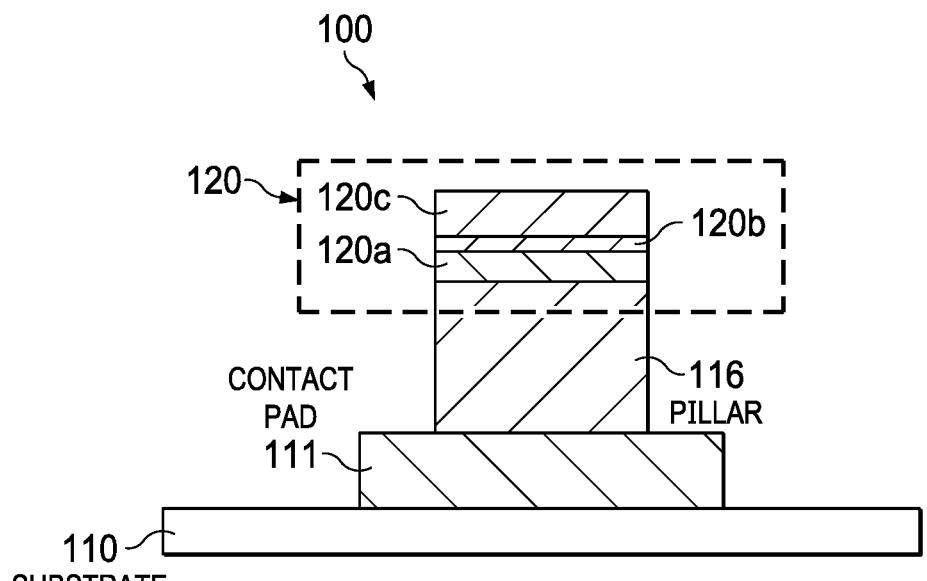
FIG. 1A and FIG. 1B are cross-sectional depictions of an electronic assembly comprising a substrate including an electronic interconnect on its contact pads comprising a pillar having a disclosed solder cap layer stack thereon, where the solder cap layer stack includes an embedded metal material layer including copper or a copper alloy that is between a bottom solder material layer on the pillar and a capping solder layer that is on the metal material layer, before solder reflow and after solder reflow, respectively, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1B:
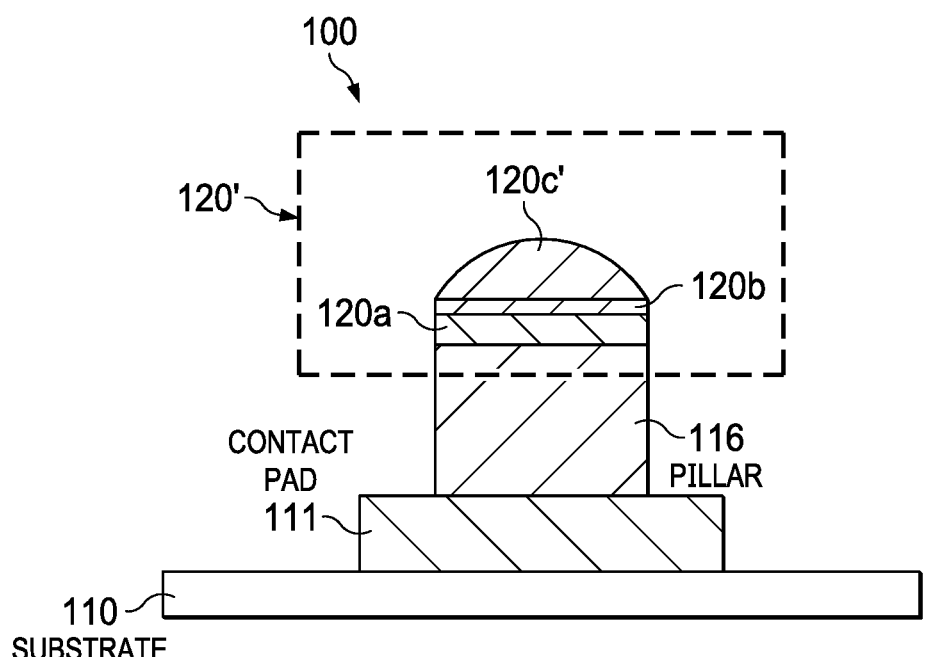

FIG. 1A and FIG. 1B are cross-sectional depictions of an electronic assembly 100 comprising a substrate 110 including an electronic interconnect on its contact pads 111 comprising a metal pillar (pillar) 116 having a disclosed solder cap layer stack 120 thereon. The solder cap layer stack 120 includes an embedded metal material layer 120b including copper or a copper alloy that is between a bottom solder material layer 120a on the pillar 116, and a capping solder layer 120c is on the metal material layer 120b. FIG. 1A depicts the electronic assembly 100 before solder reflow and FIG. 1B depicts the electronic assembly 100 after solder reflow. The thickness of the metal material layer 120b or an integrated thickness for a precursor metal layer in the case of consuming all the metal material layer 120b for forming an intermetallic compound (IMC) layer has a thickness of 0.5 µm to 4 µm. Although only a single embedded metal material layer 120b is shown, optionally there can be two or more embedded metal material layers between bottom and top solder layers.

Disclosed solder layers such as the bottom solder material layer 120a and the capping solder layer 120c can be deposited by electroplating, sputtering, or by using a solder in paste form. A solder paste is essentially powder metal solder suspended in a thick medium called flux. Flux is added to act as a temporary adhesive, holding the components until the soldering process melts the solder and fuses the components together. The solder paste is generally a gray, putty-like material. Conventionally the solder paste is applied with a tool conventionally called a stencil.

After reflow processing for the electronic assembly 100 as shown in FIG. 1B, the capping solder layer is now shown as 120c' because it has flowed, with the solder cap layer stack now shown as 120'. When solder layers are heated when in contact with a copper layer, there are phenomena involving the development of a nucleus and the subsequent formation and the growth of IMCs. Accordingly, the reaction between the copper and the Sn in the solder results in an equilibrium state inducing the IMC beginning to form at the interface between the solder and the copper layer. It is well known that the Cu—Sn soldering system has two interfacial phases which are $Cu_6Sn_5$ and $Cu_3Sn$ phases.

In the case the substrate 110 comprises a semiconductor die, the die generally includes circuitry 170 (see circuitry 170 shown in FIG. 3 describe below) comprising circuit elements (including transistors, and generally diodes, resistors, capacitors, etc.) formed on a substrate having a semiconductor surface, such as in an epitaxial layer on a bulk semiconductor substrate, that is configured together for generally realizing at least one circuit function. Example circuit functions include analog (e.g., amplifier or power converter), radio frequency (RF), digital, or non-volatile memory functions. In the case of a semiconductor substrate the contact pad 111 can comprise a bond pad or the bump pad in the case of an RDL.

Figure 2A:
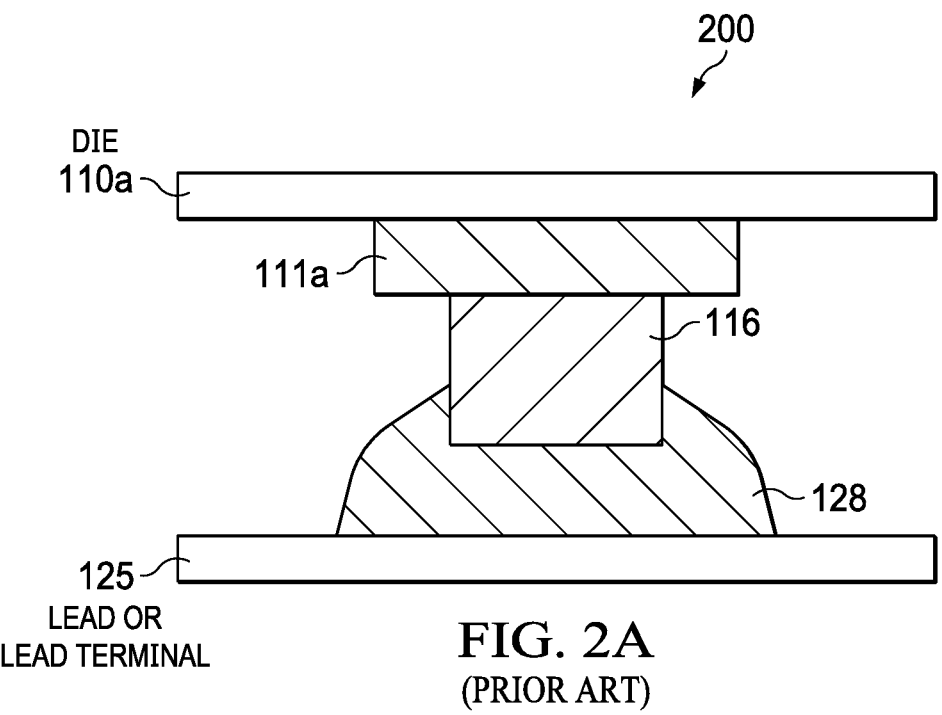
FIG. 2A is a cross sectional view of a conventional electronic assembly comprising a semiconductor die having a conventional electrical interconnect comprising solder capped pillars on its bond pads or bump pads assembled onto contact pads of another substrate shown as a lead or a lead terminal of a leadframe.

FIG. 2A is a cross sectional view of a conventional electronic assembly 200 comprising a semiconductor die 110a having solder capped pillars 128/116 (solder cap 128 on a pillar 116) on bond pads or bump pads 111a on the top surface of the semiconductor die 110a. The solder capped pillars 128/116 are assembled onto contact pads of another substrate shown as a lead or a lead terminal of a leadframe, with a lead or lead terminal identified as 125.

Figure 2B:
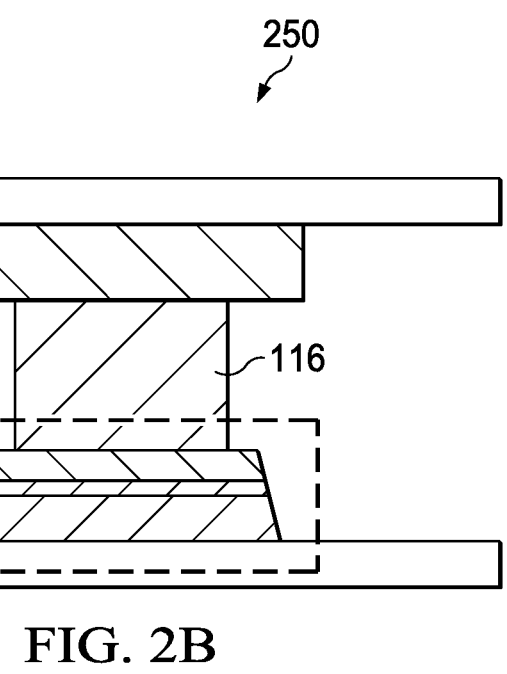
FIG. 2B is a cross sectional view of an example electronic assembly comprising a semiconductor die having an electrical interconnect comprising a solder cap layer stack on pillars on its bond pads or bump pads assembled onto contact pads of another substrate shown as a lead or a lead terminal of a leadframe, according to an example aspect.

FIG. 2B is a cross sectional view of an example electronic assembly 250 comprising a semiconductor die 110a having an electrical interconnect comprising a solder cap layer stack 120 on pillars 116 on bond pads or bump pads 111a assembled onto contact pads of another substrate. The contact pads of the another substrate is again identified as a lead or a lead terminal 125.

Figure 3:
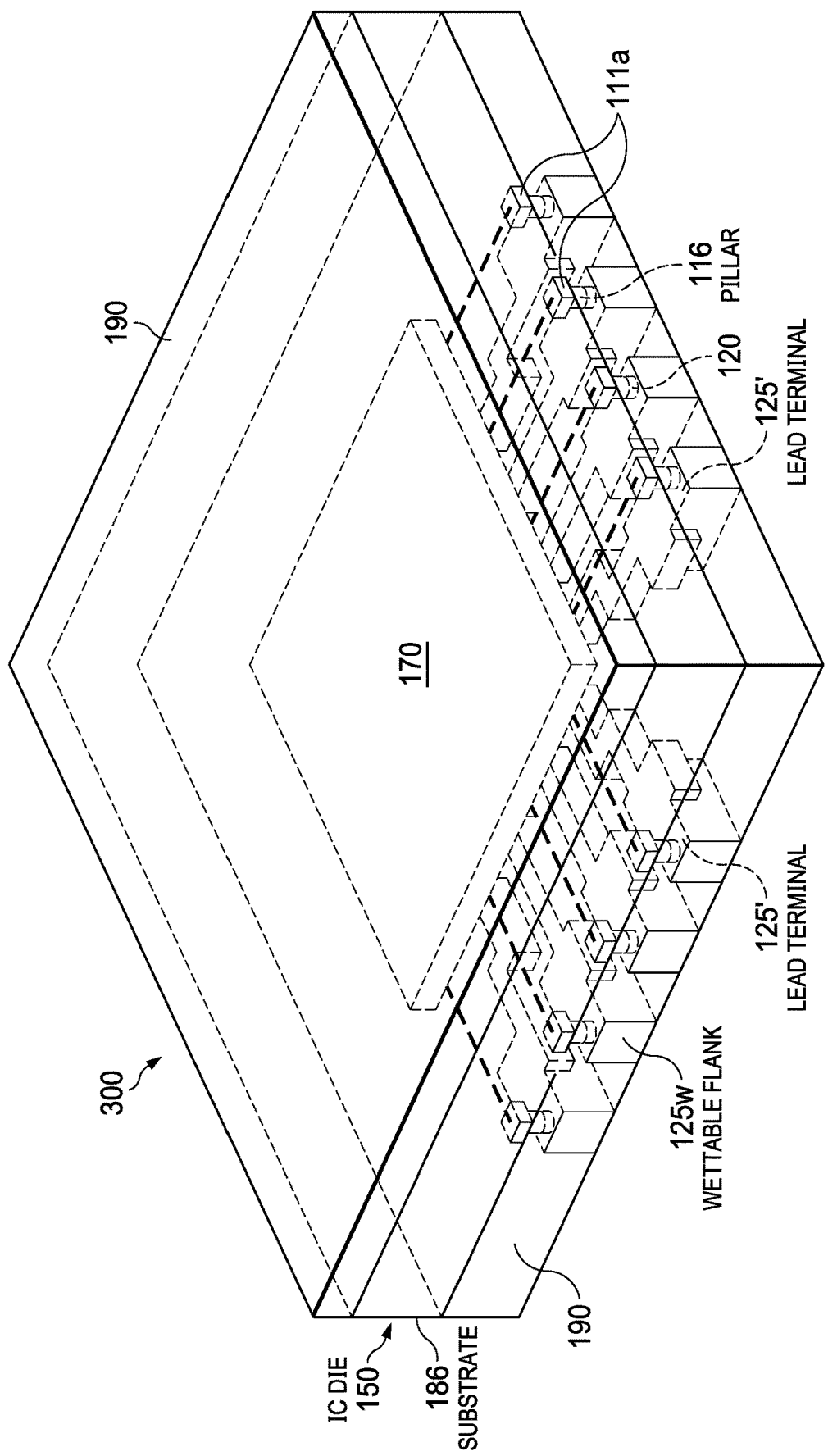
FIG. 3 depicts a packaged QFN device having disclosed electrical interconnects comprising a solder cap layer stack on pillars on its bond pads or bump pads for electrical connection between the bond pads or bump pads on the IC die and leads or lead terminals shown as lead terminals of QFN leadframe, according to an example aspect.

FIG. 3 depicts a packaged semiconductor device shown as a QFN package 300 having disclosed electrical interconnects comprising a solder cap layer stack 120 on pillars 116 on its bond pads or bump pads 111a, for an electrical connection between the bond pads or bump pads 111a on the IC die 150 comprising a semiconductor substrate 186 having circuitry 170, and leads or lead terminals 125' of a QFN leadframe. The QFN package 300 is shown as a perspective three-dimensional (3D) partial see-through view having 16 lead terminals/pins, 4 lead terminals/pins on each side of the QFN package 300, with 2 sides being shown in FIG. 3, with the 16 lead terminals/pins being only for example. The circuitry 170 has nodes coupled to bond pads 111a that have bonding features shown as a solder cap layer stack 120 on pillars 116.

The dashed lines shown between the circuitry 170 and the bond pads or bump pads 111a represent the bond pads or bump pads 111a are on the surface of the semiconductor substrate 186 and are connected to nodes in the circuitry 170. The IC die 150 does not extend to an outer surface QFN package 300, and is thus recessed from an outer edge of the QFN package 300 by the mold compound 190 which provides encapsulation for the QFN package 300. The lead terminals 125' can be seen to have a side edge and bottom side exposed by the mold compound 190. The exposed side edge of the lead terminals 125' is identified in FIG. 3 as a wettable flank 125w that can be used for solder integrity inspection after assembly of the QFN package 300 to another substrate, such as to a PCB.

Figure 4:
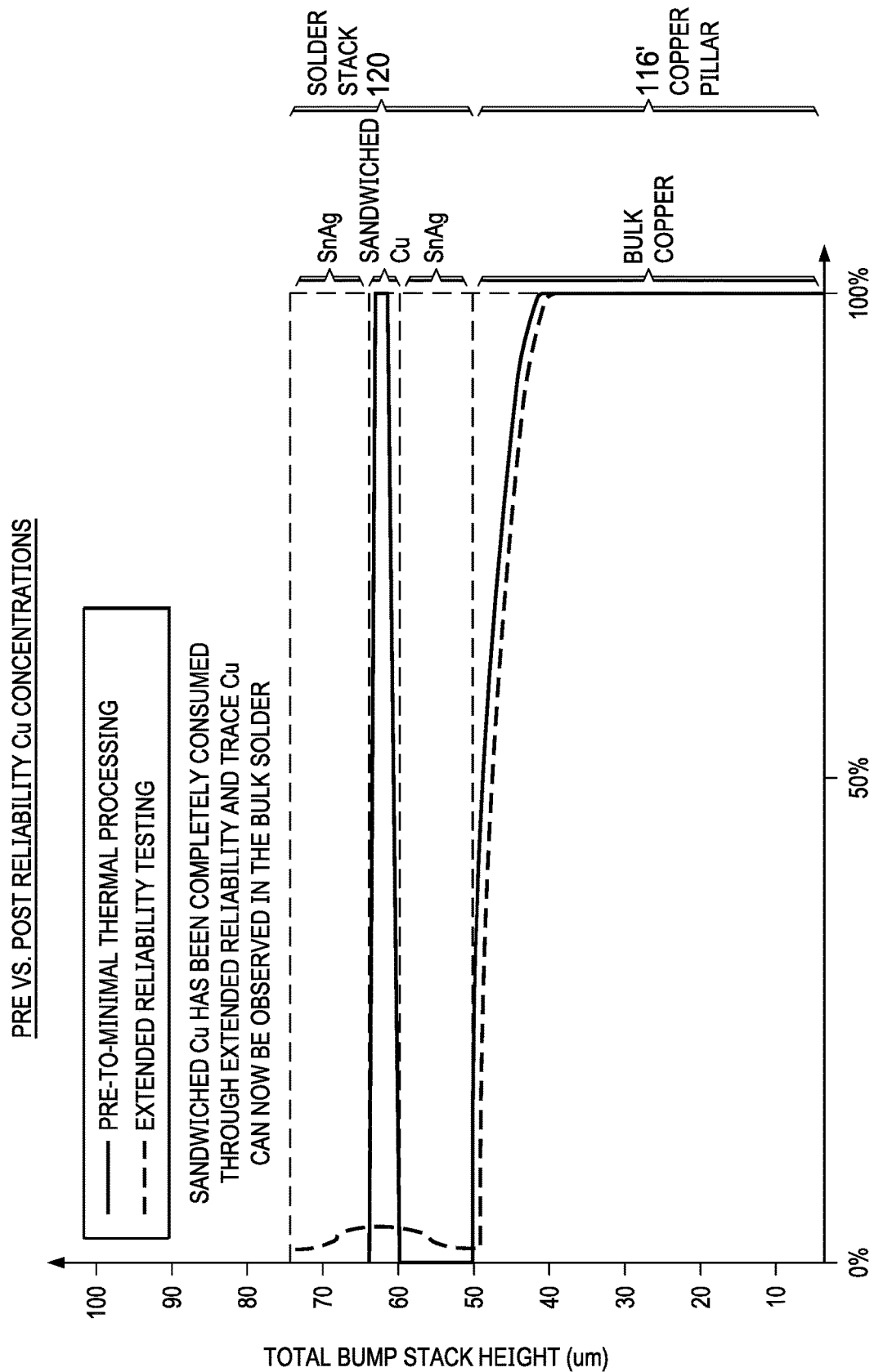
FIG. 4 depicts the copper atomic concentration as a function of height for a disclosed bump stack including a solder comprising layer stack on a 50 µm tall copper pillar. In this example, the bottom solder material layer and the capping solder layer were both about 10 µm thick, and the as-deposited metal comprising layer was a copper layer that was about 3 µm thick. Results are shown for minimal thermal processing and also after extended reliability testing.

FIG. 4 depicts the copper atomic concentration as a function of height for a disclosed bump stack including a solder comprising layer stack 120 on a 50 µm tall copper pillar shown as 116'. In this example, the bottom solder material layer and the capping solder layer were both about 10 µm thick, and the as-deposited metal comprising layer was a copper layer that was essentially 100% copper which was about 3 µm thick. Results are shown for minimal thermal processing (after a solder reflow of 250° C. for five minutes), and also after extended reliability testing (750 cycles of −65 to 150° C. and 170° C., and 750 hrs of HTS. It can be seen that after the minimal thermal processing the copper layer is still present in the middle of the solder comprising layer stack 120. However, after extended reliability testing, it can be seen that the copper layer due to diffusion has been completely consumed, with trace copper observed in the bulk solder material on both sides of the remnants of the as-deposited copper layer that is generally configured as an IMC comprising layer. The remnants of the solder layer is evidenced by a significant increase in copper concentration in the location of the as-deposited copper layer shown by example having a peak copper concentration of about 3 to 4 atomic %.

Disclosed aspects can be integrated into a variety of assembly flows to form a variety of different semiconductor integrated circuit (IC)-based devices and related products. The electronic assembly can comprise single semiconductor die or multiple semiconductor die, such as comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Examples

Disclosed aspects are further illustrated by the following specific Examples, which should not be construed as limiting the scope or content of this Disclosure in any way.

Figure 5:
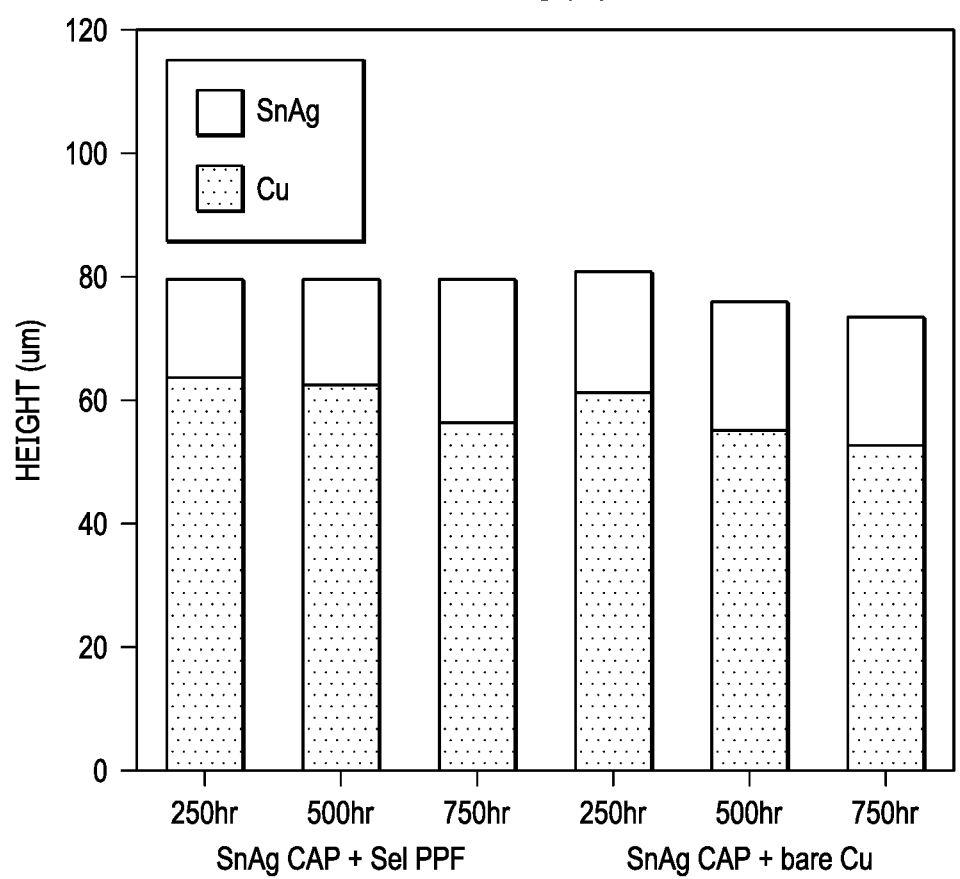
FIG. 5 depicts an example of copper consumption occurring during temperature cycling (TC) 750 cycles of −65/150° C. and 170° C., 750 hrs of high temperature storage (HTS) into the neighboring solder layers for a disclosed electrical interconnect comprising a solder cap layer stack on pillars solder cap on a copper pillar. The data shows that a certain amount of copper has been consumed through reliability testing. The plot shows through reliability testing the copper of the stack is lessening in thickness. This means that more copper is being consumed or is diffusing into the bulk solder region, both above and below the as-deposited copper layer.

FIG. 5 depicts an example of copper consumption occurring during temperature cycling (TC) comprising 750 cycles of −65/150° C. and 170° C., 750 hrs of HTS into the neighboring solder layers for a disclosed electrical interconnect comprising a solder cap layer stack on a copper pillar. The "SEL space PPF" shown means selective pre-plated leadframe which can comprise a nickel and palladium plating on the leadframe/substrate bump landing areas which is included herein to evidence disclosed aspects are applicable to various leadframe finishes (bare copper or copper with selective plating thereon). This data in FIG. 5 shows that a certain amount of copper has been consumed through reliability testing. The plot also shows through reliability testing the copper of the solder cap layer stack is lessening in thickness as the time increases. This means that more copper is being consumed or is diffusing into the bulk solder regions, both above and below the as-deposited copper layer.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. An electronic assembly, comprising:
a semiconductor die comprising a semiconductor surface layer having circuitry configured for a function that includes at least one redistribution layer (RDL) and bump pads provided by the RDL, the bump pads including metal pillars thereon;
a solder comprising layer stack on the pillars, the solder comprising layer stack comprising:
a bottom solder material layer including in physical contact with a top surface of the pillars;
a metal material layer on the bottom solder material layer, and
a capping solder material layer on the metal material layer,
wherein the metal material layer comprises primarily copper or an intermetallic compound (IMC) comprising layer including copper.

2. The electronic assembly of claim 1, wherein the bottom solder material layer and the capping solder material layers both comprise tin and silver (AgSn).

3. The electronic assembly of claim 1, wherein the pillars comprise copper pillars that are in a height range from 40 to 70 µm.

4. The electronic assembly of claim 1, wherein the metal material layer or an integrated thickness for a precursor for the metal material layer for the IMC comprising layer has a thickness that is 0.5 µm to 4 µm.

5. The electronic assembly of claim 1, wherein the substrate comprises a semiconductor die comprising a semiconductor surface layer having circuitry configured for a function, wherein the contact pads comprise bond pads.

6. The electronic assembly of claim 1, further comprising a mold compound for providing encapsulation for the electronic assembly.

7. An electronic assembly, comprising:
a laminate substrate having land pads with metal pillars thereon;
a solder comprising layer stack on the pillars, the solder comprising layer stack comprising:
a bottom solder material layer including in physical contact with a top surface of the pillars;
a metal material layer on the bottom solder material layer, and
a capping solder material layer on the metal material layer,
wherein the metal material layer comprises primarily copper or an intermetallic compound (IMC) comprising layer including copper.

8. The electronic assembly of claim 7, wherein the bottom and the capping solder material layers both comprise silver and tin (AgSn), and wherein the pillars comprise copper pillars that are in a height range from 40 to 70 µm.

9. The electronic assembly of claim 7, further comprising a mold compound for providing encapsulation for the electronic package.

10. A method of fabricating an electronic assembly, comprising:
    forming a solder comprising layer stack on pillars on contact pads of a substrate having a semiconductor surface or on land pads of a laminate substrate, the solder comprising layer stack, including:
        dispensing a bottom solder material layer including in physical contact with a top side of the pillars;
        forming a metal material layer including copper on the bottom solder material layer, and
        dispensing a capping solder material layer on the metal material layer.

11. The method of claim 10, wherein the bottom solder material layer and the capping solder material both comprise tin and silver (SnAg).

12. The method of claim 10, wherein the metal material layer is thinner as compared to a thickness of the bottom solder material layer and a thickness of the capping solder material.

13. The method of claim 10, wherein the dispensing of the bottom solder material layer and the dispensing of the capping solder material layer both comprise electroplating tin and silver (SnAg).

14. The method of claim 10, wherein the metal material layer or an integrated thickness for a precursor copper layer for the IMC comprising layer has a thickness that is 0.5 µm to 4 µm.

15. The method of claim 10, wherein the pillars are on the land pads of a laminate substrate.

16. A method of fabricating an electronic assembly, comprising:
    forming a solder comprising layer stack on pillars on contact pads of a substrate having a semiconductor surface or on land pads of a laminate substrate, the solder comprising layer stack, including:
        dispensing a bottom solder material layer including in physical contact with a top side of the pillars;
        forming a metal material layer including copper on the bottom solder material layer, and
        dispensing a capping solder material layer on the metal material layer;
    wherein the substrate having the semiconductor surface comprises a wafer having a plurality of semiconductor die each comprising a semiconductor surface layer having circuitry configured for a function, and wherein the contact pads comprise bond pads or bump pads;
    singulating the wafer to provide a plurality of the semiconductor die;
    further comprising placing the semiconductor die on a leadframe having a die pad and leads or lead terminals at least two sides of the die pad, and
    reflowing to diffuse metal in the metal material layer to form an intermetallic compound (IMC) comprising layer in the bottom solder material layer and in the capping solder material layer.

17. The method of claim 16, wherein the substrate comprises a semiconductor die comprising a semiconductor surface layer having circuitry configured for a function that includes at least one redistribution layer (RDL), and wherein the contact pads comprise bump pads provided by the RDL.

18. The method of claim 16, further comprising forming a mold compound for providing encapsulation for the electronic assembly.

* * * * *